(12) United States Patent
Childs et al.

(10) Patent No.: US 7,800,959 B2
(45) Date of Patent: Sep. 21, 2010

(54) MEMORY HAVING SELF-TIMED BIT LINE BOOST CIRCUIT AND METHOD THEREFOR

(75) Inventors: Lawrence F. Childs, Austin, TX (US); Craig D. Gunderson, Round Rock, TX (US); Olga R. Lu, Austin, TX (US); James D. Burnett, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 130 days.

(21) Appl. No.: 12/233,922

(22) Filed: Sep. 19, 2008

(65) Prior Publication Data

US 2010/0074032 A1     Mar. 25, 2010

(51) Int. Cl.
*G11C 16/00*     (2006.01)

(52) U.S. Cl. .................. 365/189.08; 365/189.16; 365/190; 365/203

(58) Field of Classification Search ............ 365/189.17, 365/189.06
See application file for complete search history.

(56) References Cited

U.S. PATENT DOCUMENTS

| | | | | |
|---|---|---|---|---|
| 5,091,889 A | * | 2/1992 | Hamano et al. .......... | 365/233.5 |
| 5,153,855 A | * | 10/1992 | Konishi ................ | 365/229 |
| 5,475,635 A | * | 12/1995 | Nogle .................. | 365/189.02 |
| 5,619,456 A | * | 4/1997 | McClure ............... | 365/189.17 |
| 5,751,642 A | * | 5/1998 | Yoo .................... | 365/189.06 |
| 5,841,706 A | * | 11/1998 | Umezaki et al. ....... | 365/189.11 |
| 5,886,947 A | * | 3/1999 | Lee .................... | 365/233.1 |
| 5,973,972 A | * | 10/1999 | Kwon et al. ............ | 365/203 |
| 6,026,035 A | * | 2/2000 | Kim .................... | 365/190 |
| 6,097,653 A | | 8/2000 | Park | |
| 6,104,653 A | * | 8/2000 | Proebsting ............ | 365/203 |
| 6,671,201 B2 | | 12/2003 | Masuda | |

(Continued)

FOREIGN PATENT DOCUMENTS

JP    2005276277 A    6/2005

(Continued)

OTHER PUBLICATIONS

IBM Technical Dislosure; "Techniques for Improving Writability of SRAM Design", Nov. 2, 2007.

(Continued)

*Primary Examiner*—Tan T. Nguyen
(74) *Attorney, Agent, or Firm*—Daniel D. Hill; James L. Clingan, Jr.

(57) ABSTRACT

A memory has an array of memory cells, column logic, a write driver, a voltage detector, and a bootstrap circuit. The array of memory cells is coupled to pairs of bit lines and word lines. The column logic is coupled to the array and is for coupling a selected pair of bit lines to a pair of data lines. The write driver is coupled to the pair of data lines. The voltage detector provides an initiate boost signal when a voltage of a first data line of the pair of data lines drops below a first level during the writing of the pair of data lines by the write driver. The bootstrap circuit reduces the voltage of the first data line in response to the boost enable signal. This is particularly beneficial when the number of memory cells on a bit line can vary significantly as in a compiler.

20 Claims, 5 Drawing Sheets

U.S. PATENT DOCUMENTS

| | | |
|---|---|---|
| 6,930,939 B2 * | 8/2005 | Lim et al. .................... 365/203 |
| 6,952,377 B2 | 10/2005 | Chung |
| 7,366,007 B2 | 4/2008 | Kanehara |
| 7,411,815 B2 | 8/2008 | Gogl |
| 7,457,181 B2 * | 11/2008 | Lee et al. .................... 365/208 |
| 2007/0081379 A1 | 4/2007 | Clinton et al. |
| 2007/0109878 A1 | 5/2007 | Goulin et al. |
| 2007/0268738 A1 | 11/2007 | Heinrich-Barna et al. |
| 2008/0130378 A1 | 6/2008 | Nautiyal |

FOREIGN PATENT DOCUMENTS

| | | |
|---|---|---|
| JP | 2007109300 A | 4/2007 |

OTHER PUBLICATIONS

PCT Application No. PCT/US2009/052817; Search Report and Written Opinion dated Feb. 22, 2010.

* cited by examiner

MEMORY HAVING SELF-TIMED BIT LINE BOOST CIRCUIT AND METHOD THEREFOR

BACKGROUND

1. Field

This disclosure relates generally to memories, and more specifically, to a memory having a self-timed bit line boost circuit and method therefor.

2. Related Art

Static random access memories (SRAMs) are generally used in applications requiring high speed, such as memory in a data processing system. Each SRAM cell stores one bit of data and is implemented as a pair of cross-coupled inverters. The SRAM cell is only stable in one of two possible voltage levels. The logic state of the cell is determined by whichever of the two inverter outputs is a logic high, and can be made to change states by applying a voltage of sufficient magnitude and duration to the appropriate cell input. The stability of a SRAM cell is an important issue. The SRAM cell must be stable against transients, process variations, soft error, and power supply fluctuations which may cause the cell to inadvertently change logic states. Also, the SRAM cell must provide good stability during read operations without harming speed or the ability to write to the cell.

However, good read stability can make it difficult to write to the memory cells. Also, process variations can cause some cells of the array to be more difficult to write than others. One way to have both good write performance and good read stability is to lower the power supply voltage for write operations. Changing the power supply voltage during write operations requires precise timing to insure effectiveness without impacting write operation cycle time significantly. Changing the supply voltage too early is ineffective and changing the supply voltage too late increases cycle time.

Therefore, what is needed is a memory, and a method for operating the memory, that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
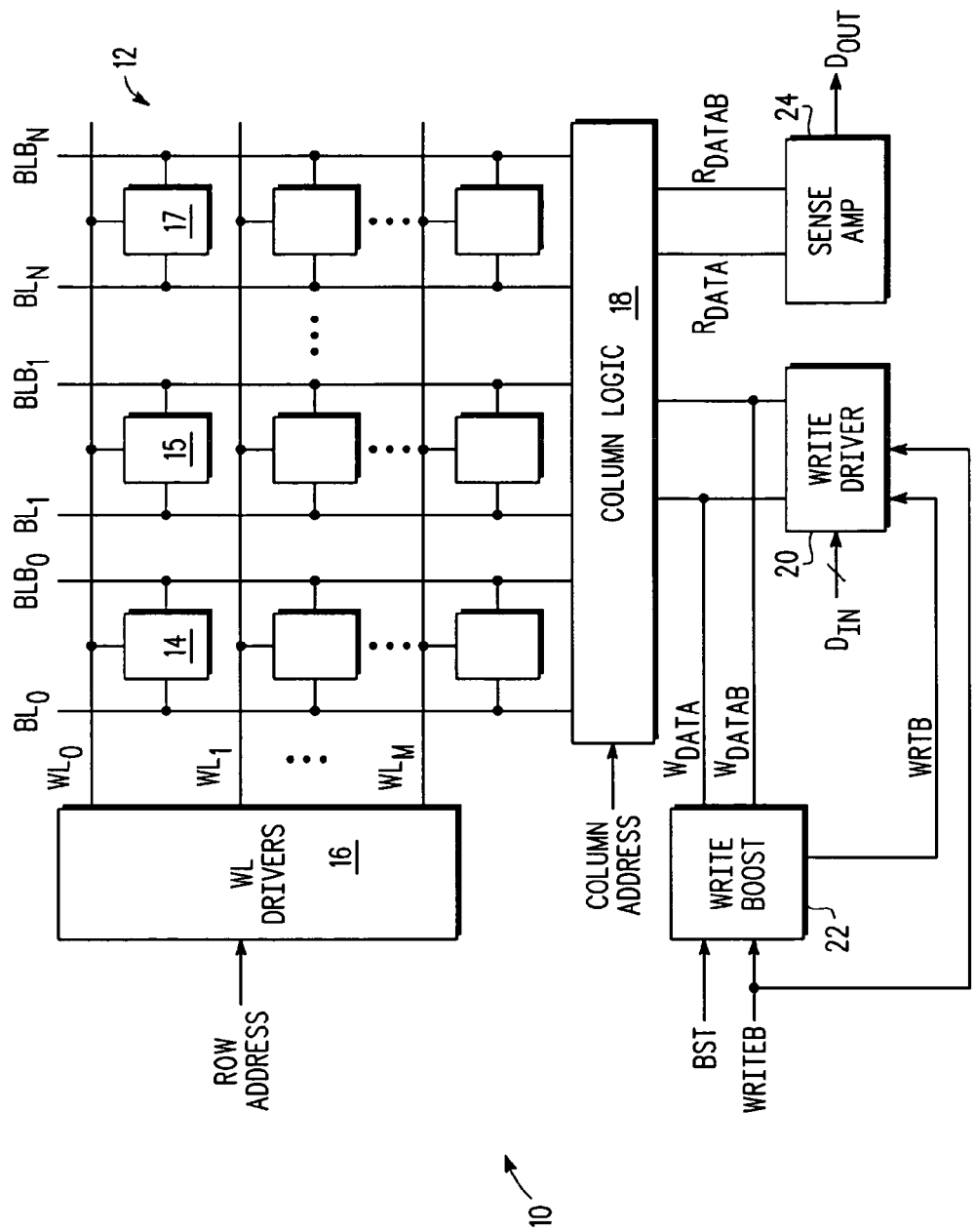
FIG. 1 illustrates, in block diagram form, an integrated circuit memory in accordance with an embodiment.

Generally, there is provided, a memory having a boost circuit to boost a bit line voltage to below ground level during a write operation. The boost circuit includes a detection circuit that detects when a selected one of the bit lines is pulled low during the write operation. When the voltage on the bit line is reduced to a predetermined voltage, the boost circuit is activated to lower the bit line voltage from the predetermined voltage to a voltage below ground level. In one embodiment, the predetermined voltage is substantially ground (zero volts). In another embodiment, the predetermined voltage is 70 millivolts (mV) or less above ground. Also, in one embodiment, the boost circuit includes a capacitor coupled to each of the selected bit lines. The capacitor is coupled to boost the bit line voltage below ground in response to a boost signal. The boost signal is generated in response to detecting the lowered bit line during a write operation. The memory is a static random access memory (SRAM) is a preferred embodiment, and the boosted bit line is one of a pair of bit lines coupled to a memory cell.

By providing the bit line boost voltage to the bit line in response to detecting the transition of the bit line voltage during a write operation, the bit line voltage is boosted at the correct time during a write operation to insure that a selected memory cell is reliably written. Because the detection circuit detects a predetermined voltage level on the bit line, the detection circuit operates independently of the ramp rate of the bit line. This allows the boost circuit to be used in memories based on compiler architectural techniques, and the same boost circuit can be used with a variety of array sizes and array configurations.

The integrated circuit memory described herein can be implemented with any semiconductor material or combinations of materials, such as gallium arsenide, silicon germanium, silicon-on-insulator (SOI), silicon, monocrystalline silicon, the like, and combinations of the above.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or the letter "B" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

FIG. 1 illustrates, in block diagram form, an integrated circuit memory 10 in accordance with an embodiment. Integrated circuit memory 10 includes memory array 12, word line drivers 16, column logic 18, write driver 20, write boost circuit 22, and sense amplifier 24. Memory array 12 includes a plurality of memory cells, such as memory cells 14, 15, and 17, organized in M+1 rows and N+1 columns, where M and N can be any integer. In a preferred embodiment, the size and configuration of memory array 12 is based on a customer's specifications, and is implemented using compiler architectural techniques. A column of memory cells includes a bit line pair and all of the memory cells connected to the bit line pair. For example, bit line pair BL0/BLB0 and the memory cells coupled to bit line pair BL0/BLB0, such as memory cell 14, comprise a column. Also, bit line pairs BL1/BLB1 and BLN/BLBN, with their respective memory cells, such as memory cells 15 and 17, each comprise a column. Likewise, a row of memory cells includes a word line and all of the memory cells connected to the word line. For example, word line WL0 and memory cells 14, 15, and 17 comprise a row. Also, word lines WL1 and WLM and the memory cells coupled thereto each comprises a row.

Word line drivers 16 is coupled to all of the word lines of memory array 12, and in response to a row address ROW ADDRESS, provides a word line voltage to all of the memory cells of a row. The row address ROW ADDRESS may be provided by row decoders and predecoders (not shown). Column logic 18 is coupled to all of the bit lines of memory array 12, and in response to a column address COLUMN ADDRESS selects a bit line pair for a read or write operation. Column logic 18 includes column decoders, precharge and equalization circuits, bit line loads, and the like. The memory cell at an intersection of a selected row and a selected column can then to be accessed. If the access is a read access, then a stored state in the memory cell is provided to the bit lines in the form of a relatively small differential voltage between the bit lines of a bit line pair. Column logic 18 couples the selected bit line to a sense amplifier of sense amplifier 24. Column logic 18 may include selection circuits, such as a multiplexer, for coupling one of several bit lines to a shared sense amplifier. In one embodiment, there are 8 bit line pairs for each shared sense amplifier. Column logic 18 is coupled to sense amplifier 24 via read data lines RDATA/RDATAB.

During a read operation, sense amplifier 24 senses and amplifies the relatively small differential voltage on the selected bit line pair and provides the stored logic state of the selected memory cell as a signal DOUT to output circuitry (not shown). If the access is a write access, write driver 20 will receive an input date bit DIN to be written to a selected memory cell, such as for example, memory cell 14. To begin the write operation, a write enable signal WRITEB is asserted as a logic low. The data signal DIN is provided to a differential pair of data lines WDATA/WDATAB coupled between write driver 20 and column logic 18. Column logic 18 couples the data line pair to the selected bit line pair and thus to the selected memory cell. A differential voltage on the bit line pair causes a logic state of the storage nodes of the selected memory cell to change state, if necessary. The differential voltage will cause one of the bit lines to remain at a relatively high voltage, preferably equal to about VDD, and the other bit line will be pulled to a relatively low voltage. Typically, the relatively low voltage will be about zero volts, or ground. In the illustrated embodiment, the memory cell is a SRAM cell. Also, in other embodiments there may be more than one write data line pair WDATA/WDATAB and read data line pair RDATA/RDATAB. In addition, in other embodiments, write and read data may be transmitted on the same data line pair.

Due to high yield requirements for the large number of memory cells used on a typical SOC (system on a chip), and a relatively high statistical variation of the memory cells on a processed wafer, some memory cells will be weaker and more difficult to write than other memory cells. If the memory cell, such as memory cell 14, is more difficult to write because of, for example, process variations that increase a threshold voltage of the cell, the cell may not be successfully written. Low power supply voltages will make the problem worse. In accordance with the illustrated embodiment, the ability to write to the memory cells is improved by boosting the voltage on data line pair WDATA/WDATAB negative, or below ground potential. During the write operation, write boost circuit 22 receives an active high boost enable signal BST and an active low write enable WRITEB. Initially, the voltage on the bit line pairs and data line pair WDATA/WDATAB is precharged and equalized to about the voltage provided by the positive power supply voltage. During the write operation, one of the bit lines of the bit line pair will be pulled low. The corresponding data line of data line pair WDATA/WDATAB will be pulled low. Write boost circuit 22 will detect the logic low voltage on the data line and cause the voltage on the logic low bit line to be pulled to a negative voltage. The negative voltage will temporarily improve the write margin and thus assist the selected memory cell to change logic states. To provide the most benefit to the write operation, it is important that the bit line voltage be boosted at the correct time. In one embodiment, the bit line voltage is boosted negative as the bit line voltage is detected to drop to 70 millivolts or below. To prevent write driver 20 from providing a current path to ground, a disable signal WRTB is provided to disable write driver 20 while the data line is being pulled negative. Boost enable signal BST is enabled for normal operation. During testing of memory 10, boost enable signal BST is used to disable write boost circuit 22 to prevent boosting and facilitate testing of the memory cells of memory array 12.

Figure 2:
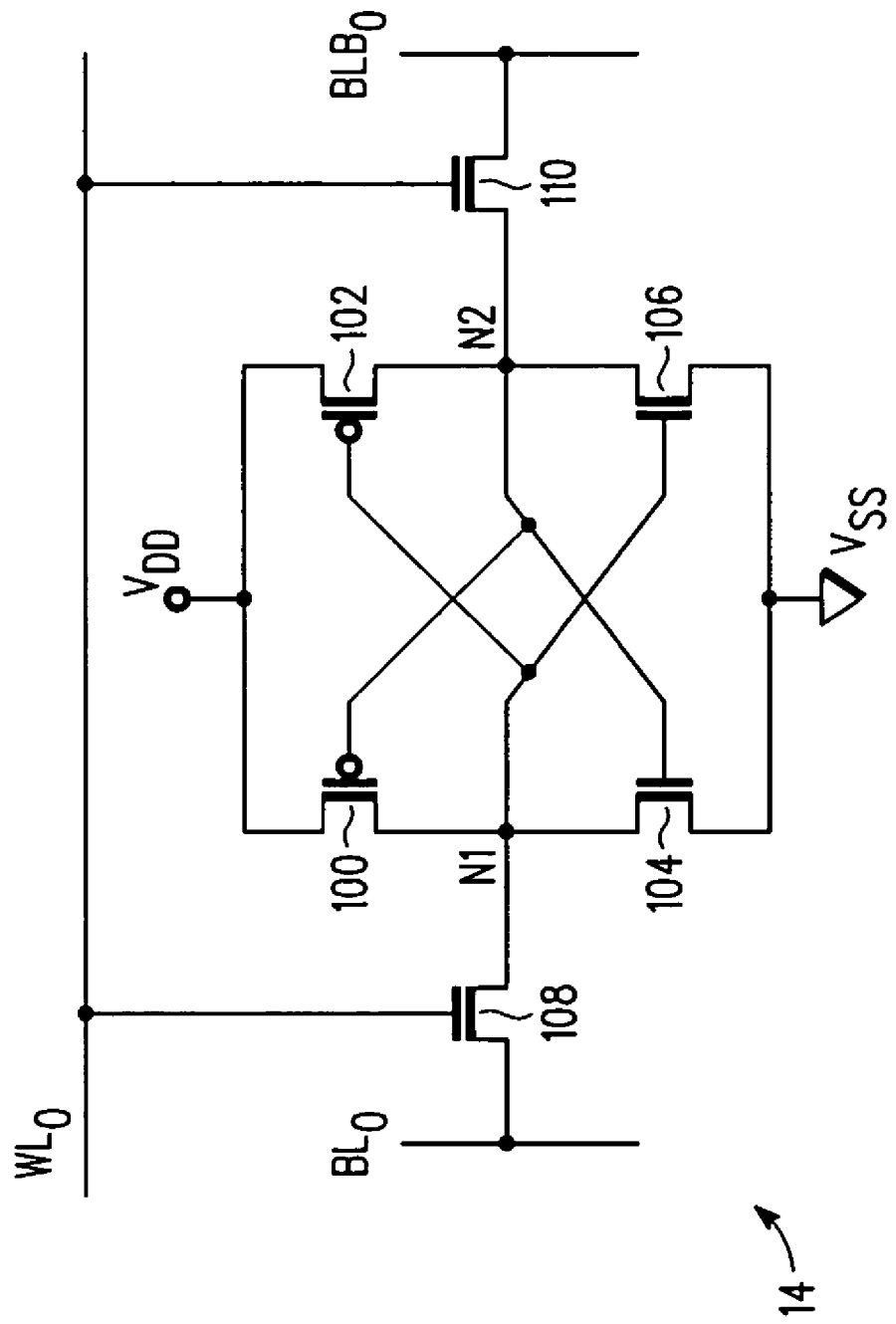
FIG. 2 illustrates, in schematic diagram form, a memory cell of the memory of FIG. 1.

FIG. 2 illustrates, in schematic diagram form, a representative memory cell 14 of memory 10 of FIG. 1. Memory cell 14 is a conventional 6 transistor SRAM cell and includes pull-up P-channel transistors 100 and 102, N-channel transistors 104 and 106, and access, or pass, N-channel transistors 108 and 110. Generally, as illustrated in FIG. 2, transistors 100, 102, 104, and 106 are coupled together to form a pair of cross-coupled inverters. Storage nodes N1 and N2 are located between the pair of cross-coupled inverters. Access transistor 108 is coupled between storage node N1 and bit line BL0. Access transistor 110 is coupled between storage node N2 and bit line BLB0. The gate of transistors 108 and 110 are coupled to word line WL0. Power supply voltage terminal VDD is for providing a positive power supply voltage, for example, one volt, to the cross-coupled inverters of cell 14. Power supply voltage terminal VSS is coupled to ground. In other embodiments, the power supply voltage may be different.

Figure 3:
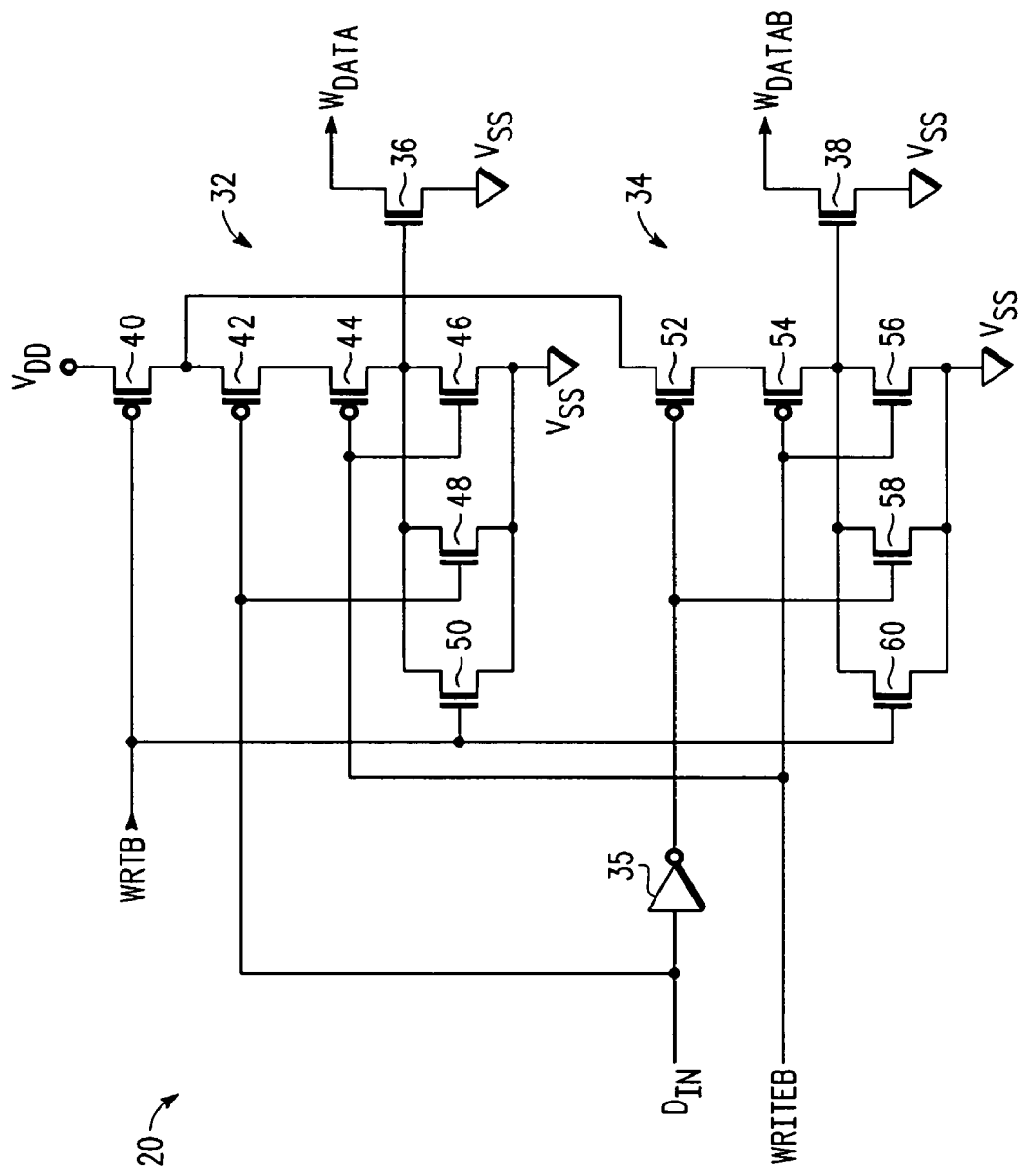
FIG. 3 illustrates, in schematic diagram form, a write driver of the memory of FIG. 1.

FIG. 3 illustrates, in schematic diagram form, write driver 20 of memory 10. Write driver 20 includes NOR logic gate 32, NOR logic gate 34, driver transistors 36 and 38, and inverter 35. NOR logic gate 32 includes P-channel transistors 40, 42, and 44, and N-channel transistors 46, 48, and 50. NOR logic gate 34 includes P-channel transistors 52 and 54, and N-channel transistors 56, 58, and 60.

Write driver 20 receives write enable signal WRITEB at gate electrodes of transistors 44, 46, 54 and 56. Signals WRITEB and WRTB are provided as active low signals to enable operation of write driver 20. When data in signal DIN is a logic low, transistor 42 is conductive causing a conductive path from VDD through the series-connected transistors 40, 42, and 44 causing a logic high voltage to be provided to the gate of drive transistor 36. Drive transistor 36 is conductive, causing data signal WDATA to be pulled to ground, or a logic low. The logic low DIN signal is inverted by inverter 35 and a logic high is provided to the gate of P-channel transistor 52. Transistor 52 is substantially non-conductive causing drive transistor 38 to be substantially non-conductive, and signal WDATAB remains as a logic high. When data in signal DIN is a logic high, transistor 42 is substantially non-conductive and transistor 48 is conductive. The gate of drive transistor 36 is pulled low and signal WDATA remains a logic high. Also, the logic high signal DIN is provided to inverter 35. In response, inverter 35 provides a logic low to the gate of transistor 52, causing transistor 52 to be conductive. N-channel drive transistor 38 is conductive, causing signal WDATAB to be pulled to ground, or a logic low. When disable signal WRTB is a logic high, operation of write driver 20 is disabled by causing P-channel transistor 40 to be substantially non-conductive and causing N-channel transistors to be conductive to insure that the gates of driver transistors 36 and 38 are pulled low. Disable signal WRTB is provided as a logic high during a portion of a write operation of memory 10 to prevent write driver 20 from interfering with the operation of write boost circuit 22 as will be discussed in connection with the discussion of FIG. 4.

Figure 4:
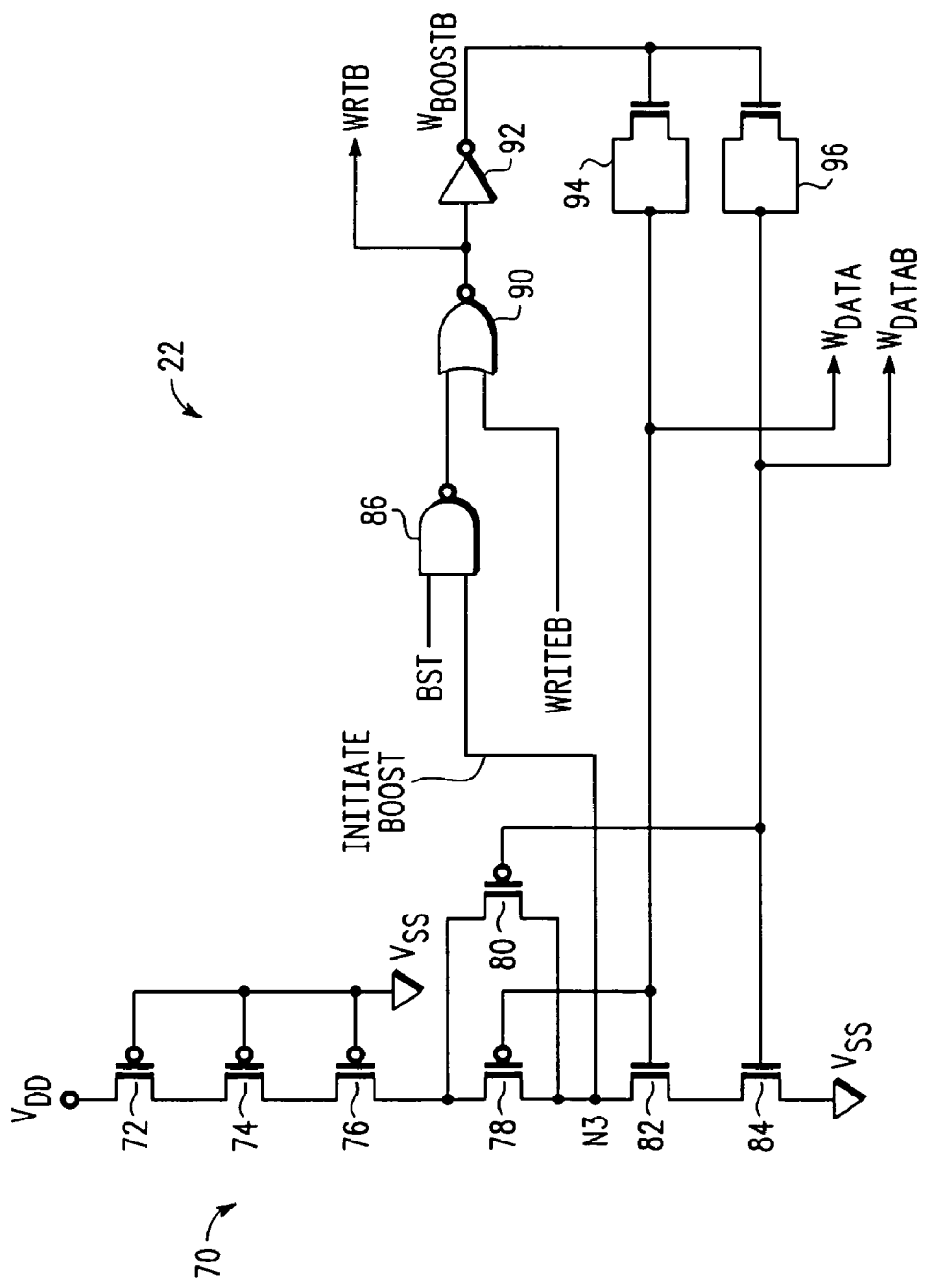
FIG. 4 illustrates, in schematic diagram form, a write boost circuit of the memory of FIG. 1.

FIG. 4 illustrates, in schematic diagram form, write boost circuit 22 of FIG. 1. Write boost circuit 22 includes voltage detector 70, bootstrap circuits 94 and 96, NAND logic gate 86, NOR logic gate 90, and inverter 92. Voltage detector 70 includes series-connected P-channel transistors 72, 74, and 76, parallel-connected P-channel transistors 78 and 80, and series-connected N-channel transistors 82 and 84. Bootstrap circuits 94 and 96 are implemented as conventional NMOS (N-type metal-oxide semiconductor) capacitors in the illustrated embodiment. A capacitance of capacitors 94 and 96 varies with a voltage across the capacitors. In other embodiments, bootstrap circuits 94 and 96 can include a different type of capacitor. Voltage detector 70 is coupled to data lines WDATA/WDATAB and is used to detect when one of the data lines is pulled below a predetermined voltage level. When the voltage on one of data lines is pulled low to the predetermined voltage, the voltage at node N3 is increased and signal INITIATE BOOST is provided to NAND logic gate 86. The point where voltage level detector 70 detects the predetermined voltage level of the data line pair can be adjusted by changing the relative threshold voltages of the P-channel and N-channel transistors. In the illustrated embodiment, P-channel transistors 72, 74, and 76 have a relatively high threshold voltage and N-channel transistors 82 and 84 have a relatively low threshold voltage. Those skilled in the art will know how to adjust the threshold voltage in N-channel and P-channel transistors to change the point at which voltage detector 70 provides a logic low INITIATE BOOST signal. The INITIATE BOOST signal is provided to a logic circuit comprising NAND logic gate 86, NOR logic gate 90, and inverter 92. In other embodiments, the logic circuit may be different. An output of the logic gate is coupled to capacitors 94 and 96 and to the output of write driver 20.

P-channel transistor 72 has a source coupled to power supply voltage terminal VDD, a gate coupled to VSS, and a drain. P-channel transistor 74 has a source coupled to the drain of transistor 72, a gate coupled to VSS, and a drain. P-channel transistor 76 has a source coupled to the drain of transistor 74, a gate coupled to VSS, and a drain. P-channel transistor 78 has a source coupled to the drain of transistor 76, a gate, and a drain coupled to node N3 for providing initiate boost signal INITIATE BOOST. P-channel transistor 80 has a source coupled to the drain of transistor 76, a gate, and a drain coupled to the drain of transistor 76. N-channel transistor 82 has a drain coupled to the drain of transistors 78 and 80, a gate coupled to the gate of transistor 78, and a source. N-channel transistor 84 has a drain coupled to the source of transistor 82, a gate coupled to the gate of transistor 80, and a source coupled to VSS. The gate of transistor 82 is also coupled to data line WDATA, and the gate of transistor 84 is also coupled to data line WDATAB. Capacitor 94 has a gate electrode coupled to receive an active low boost signal WBOOSTB, and a source and drain coupled to data line WDATA. Capacitor 96 has a gate electrode coupled to receive the active low boost signal WBOOSTB, and a source and drain coupled to data line WDATAB. NAND logic gate 86 has a first input for receiving boost enable BST, a second input for receiving an initiate boost signal INITIATE BOOST, and an output. NOR logic gate 90 has a first input coupled to the output of NAND logic gate 86, a second input coupled to receive signal WRITEB, and an output for providing disable signal WRTB.

Inverter 92 has an input coupled to the output of NOR logic gate 90, and an output for providing the boost signal WBOOSTB to capacitors 94 and 96.

Write boost circuit 22 is enabled when boost signal BST and write enable signal WRITEB are asserted. Signal BST is asserted as a logic high and signal WRITEB is asserted as a logic low. In memory 10, the bit line pairs and the write data lines are all precharged to a logic high level prior to a write operation. During the write operation, the data line pair WDATA/WDATAB is coupled to a selected bit line pair via column logic 18. When write data lines WDATA/WDATAB are high, transistors 82 and 84 are conductive and transistors 78 and 80 are substantially non-conductive, pulling the signal INITIATE BOOST at node N3 low and thus the second input to NAND logic gate 86 pulled low, causing boost signal WBOOSTB to be negated as a logic high. Disable signal WRTB will be NEGATED as a logic HIGH one gate delay before signal WBOOSTB is negated, causing the write drivers 20 (FIG. 3) to be turned off. Also, capacitors 94 and 96 are charged by the high data line voltage. In response to input data signal DIN being provided, one of the precharged write data lines WDATA/WDATAB will be pulled low by write driver 20 as described above in the discussion of FIG. 3. The logic low write data line of the write data line pair WDATA/WDATAB causes one of transistors 78 and 80 to be conductive and the corresponding one of transistors 82 and 84 to be substantially non-conductive. Initiate boost signal INITIATE BOOST is pulled high through transistors 72, 74, and 76 and one of transistors 78 or 80 depending on which write data line is pulled low. A logic low voltage from the output of NAND logic gate 86 causes a logic low WBOOSTB signal to be provided to capacitors 94 and 96. The logic low data line of data line pair WDATA/WDATAB is boosted below VSS (ground) by stored charge on the corresponding one of capacitors 94 and 96. Because the write data lines are coupled to a selected bit line pair during the write operation, the boosted voltage is provided to a bit line as well. As discussed above, boosting the voltage of the bit line temporarily improves the write margin, insuring that memory cells suffering from, for example, process variations, are more easily written. By detecting when the voltage of one of the write data lines decreases during a write operation, and then boosting the voltage in response to the detecting, the operation of write boost circuit 22 is "self-timed", thus insuring that the selected bit lines are boosted at the optimum time.

Note that in the illustrated embodiment, one voltage detector, such as voltage detector 70 in FIG. 4 is used to detect a voltage change on one of the write data lines. However, in other embodiments, there may be two separate voltage detectors, where one voltage detector is coupled to each write date line. Also, in the illustrated embodiment, the memory is implemented having separate write data line pairs (WDATA/WDATAB) and read data line pairs (RDATA/RDATAB). However, in other embodiments, the write and read data line pair may be combined into a single bus.

Figure 5:
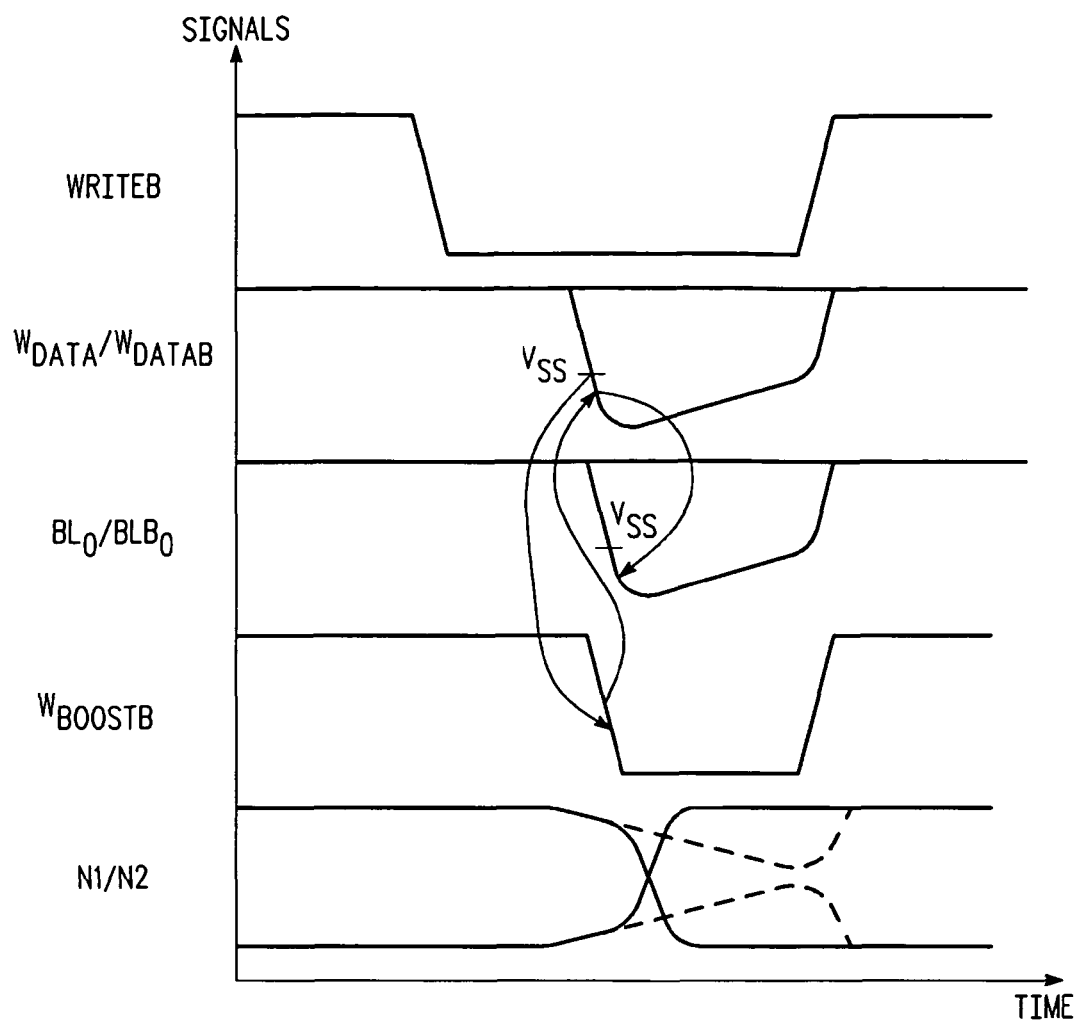
FIG. 5 illustrates a timing diagram of various signals of the memory of FIG. 1 during a write operation.

FIG. 5 illustrates a timing diagram of various signals of the memory of FIG. 1 during a write operation. The write operation is initiated by write enable signal WRITEB being asserted as a logic low, and ends when write enable signal WRITEB returns to a logic high. After signal WRITEB is asserted, data in signal DIN is provided to write driver 20. The data in signal DIN causes the precharged high differential data line pair WDATA/WDATAB to separate. As can be seen in FIG. 5, data line pair WDATA/WDATAB causes a selected bit line pair, for example, bit line pair BL0/BLB0 to separate. In response to one of WDATA/WDATAB transitioning to VSS, the boost signal WBOOSTB is asserted as a logic low voltage. In the illustrated embodiment, the voltage level at which the voltage detector detects the transitioning data line is when the data line voltage is about 70 millivolts. The voltage may be different in other embodiments. The logic low WBOOSTB signal causes one of capacitors 94 and 96 to boost the voltage on the logic low data line even lower, thus boosting the bit line voltage lower. In one embodiment, the voltage on the bit line is boosted to about 100 millivolts (mV) below ground level. In another embodiment, the boosted bit line voltage may be different. The lower bit line voltage assists the storage nodes N1/N2 of the memory cell to transition logic states, if necessary. Dashed lines for node N1/N2 indicate what might happen during the write operation if the bit line voltage is not boosted and the memory cell is suffering from defects that make it more difficult to switch logic states. As can be seen in FIG. 5, the differential bit line voltage may not be sufficient to cause the node voltages to switch states (dashed lines in FIG. 5). In the illustrated embodiment, the logic low data line is boosted below ground. In other embodiments, the boosted voltage level may be different. It has been found through experimentation that the effect of boosting the bit line negative becomes greater as the power supply voltage is decreased.

At the end of the write operation, the write enable signal returns to a logic high causing the write data lines and bit lines to again be precharged and equalized at a logic high voltage. Voltage detector 70 then causes WBOOSTB to become a logic high. The storage node voltages N1/N2 remain in their new state until rewritten.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

It is to be understood that the circuits depicted herein are merely exemplary, and that in fact many other circuits can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of memory 10 are circuitry located on a single integrated circuit or within a same device. Alternatively, memory 10 may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A memory, comprising:
 an array of memory cells coupled to pairs of bit lines and word lines;
 column logic coupled to the array for coupling a selected pair of bit lines to a pair of data lines;
 a write driver coupled to the pair of data lines;
 a voltage detector that provides an initiate boost signal when a voltage of a first data line of the pair of data lines drops below a first level during the writing of the pair of data lines by the write driver; and
 a bootstrap circuit that reduces the voltage of a first data line in response to the boost enable signal.

2. The memory of claim 1, wherein the write driver is disabled in response to the initiate boost signal.

3. The memory of claim 2, wherein the first level is less than 70 millivolts.

4. The memory of claim 1, wherein the bootstrap circuit comprises:
 a first capacitor responsive to the initiate boost signal and coupled to the first data line; and
 a second capacitor responsive to the initiate boost signal and coupled to a second data line of the pair of data lines.

5. The memory of claim 4, wherein the first and second capacitors comprise a first N channel transistor and a second N channel transistor.

6. The memory of claim 5, wherein the first N channel transistor has a source and a drain coupled to the first data line.

7. The memory of claim 4, wherein the bootstrap circuit further comprises:
a logic circuit that has a first input that receives the initiate boost signal, a second input that receives a boost enable signal, and an output coupled to the first and second capacitors.

8. The memory of claim 7, wherein the output of the logic circuit is coupled to the write driver.

9. The memory of claim 8, wherein the logic circuit comprises:
a NAND gate having an output having a first input for receiving the initiate boost signal, a second input that receives the boost enable signal, and an output;
an inverter having an input for receiving a write enable signal and an output;
a NOR gate having a first input coupled to the output of the NAND gate, a second input coupled to the output of the inverter, and an output coupled to the write driver; and
an inverter having an input coupled to the output of the NOR gate and an output coupled to the first and second capacitor.

10. The memory of claim 1, wherein the write driver is further characterized as performing a write by pulling a selected one of the data lines of the pair of data lines to a voltage near ground and being disabled in response to the initiate boost signal.

11. The memory of claim 1, wherein the voltage detector comprises a NAND gate having a first input coupled to the first data line, a second input coupled to a second data line of the pair of data lines, and an output for providing the initiate boost signal.

12. The memory of claim 1, wherein the NAND gate is further characterized as having a plurality of P channel transistors in series and between a positive power supply terminal and a power supply input of the NAND gate.

13. A method of performing a write of a memory that has an array of memory cells coupled to pairs of bit lines and word lines and column logic coupled to the array, comprising:
precharging a pair of data lines to a voltage at a first level;
coupling a selected pair of bit lines to the pair of data lines;
reducing the voltage on a first data line of the pair of data lines;
detecting when a voltage on the first data line is reduced to a second level;
in response to detecting that the first data line has been reduced to a second level, providing an initiate boost signal; and
further reducing the voltage on the first data line to a level below ground in response to the initiate boost signal being provided.

14. The method of claim 13, wherein the step of reducing the voltage is further characterized by being performed by a write driver, the method further comprising disabling the write driver in response to the initiate boost signal being provided.

15. The method of claim 13, wherein the step of further reducing the voltage is further characterized by being performed by a bootstrap circuit comprising a pair of capacitors, wherein a first capacitor of the pair of capacitors is coupled to the first data line and a second capacitor of the pair of capacitors is coupled to a second data line of the pair of data lines.

16. The method of claim 15, wherein the step of further reducing the voltage is further characterized by the pair of capacitors being characterized as having a capacitance that varies with a voltage across the capacitors.

17. The method of claim 13, wherein the step of detecting is further characterized by the first level being below 70 millivolts.

18. A memory, comprising:
an array of memory cells coupled to pairs of bit lines and word lines;
column logic coupled to the array for coupling a selected pair of bit lines to a pair of data lines;
a write driver coupled to the pair of data lines having a data input, a disable input, and a pair of data outputs coupled to the pair of data lines;
a level detection circuit having a pair of inputs coupled to the pair of data lines and an output;
a boost circuit having an input coupled to the output of the level detection circuit, a first pair of boost outputs coupled to the pair of data lines, a write driver disable output coupled to the disable input of the write driver.

19. The memory of claim 18, wherein the level detection circuit provides an initiate boost signal on its output in response to a voltage on one of the data lines of the pair of data lines dropping below a first level.

20. The memory of claim 19, wherein the first level is above ground and below 70 millivolts.

* * * * *